(12) United States Patent
Kawaguchi et al.

(10) Patent No.: US 11,525,844 B2
(45) Date of Patent: Dec. 13, 2022

(54) CURRENT SENSOR

(71) Applicant: Yazaki Corporation, Tokyo (JP)

(72) Inventors: Yasunori Kawaguchi, Shizuoka (JP); Yoshiyuki Mizuno, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 15 days.

(21) Appl. No.: 17/227,251

(22) Filed: Apr. 9, 2021

(65) Prior Publication Data

US 2021/0318358 A1 Oct. 14, 2021

(30) Foreign Application Priority Data

Apr. 13, 2020 (JP) .............................. JP2020-071435

(51) Int. Cl.
| | | |
|---|---|---|
| *G01R 15/14* | (2006.01) | |
| *G01R 31/385* | (2019.01) | |
| *G01R 19/00* | (2006.01) | |

(52) U.S. Cl.
CPC ....... *G01R 15/146* (2013.01); *G01R 19/0092* (2013.01); *G01R 31/385* (2019.01)

(58) Field of Classification Search
CPC .............. G01R 15/146; G01R 19/0092; G01R 31/385; G01R 31/364; G01R 15/00; G01R 1/203; G01R 19/32; G01R 31/3624; G01R 31/3696; G01R 31/374; G01R 31/382; G01R 15/20
USPC .................................................. 324/426, 126
See application file for complete search history.

(56) References Cited

U.S. PATENT DOCUMENTS

| | | | | |
|---|---|---|---|---|
| 2011/0050260 | A1* | 3/2011 | Teramoto | H01M 10/48 324/705 |
| 2011/0248669 | A1* | 10/2011 | Cunanan | H02J 7/00041 320/110 |
| 2016/0124023 | A1* | 5/2016 | Sato | G01R 15/146 324/126 |
| 2016/0141731 | A1* | 5/2016 | Tanigawa | H01R 13/6658 324/437 |
| 2018/0031613 | A1* | 2/2018 | Nakayama | G01R 19/25 |
| 2018/0328996 | A1* | 11/2018 | Kimura | G01R 31/364 |
| 2020/0025802 | A1* | 1/2020 | Endo | H01C 1/14 |

FOREIGN PATENT DOCUMENTS

| | | |
|---|---|---|
| EP | 3578997 A1 | 12/2019 |
| JP | 5193622 B2 | 5/2013 |

\* cited by examiner

*Primary Examiner* — Tung X Nguyen
*Assistant Examiner* — Robert P Alejnikov, Jr.
(74) *Attorney, Agent, or Firm* — Kenealy Vaidya LLP

(57) ABSTRACT

A current sensor includes a battery terminal portion that is conductive and is fastened to a battery post that extends along a first direction; a sensor unit that is located side by side with the battery terminal portion along a second direction that intersects the first direction and is electrically connected to the battery terminal portion to detect a current; and a housing that has an insulating property and embeds the sensor unit, in which the battery terminal portion includes a pair of plate-shaped portions, and the pair of plate-shaped portions are embedded in the housing with end portions on the sensor unit side in the second direction spaced apart from each other along the first direction.

2 Claims, 12 Drawing Sheets

CURRENT SENSOR

CROSS-REFERENCE TO RELATED APPLICATION(S)

The present application claims priority to and incorporates by reference the entire contents of Japanese Patent Application No. 2020-071435 filed in Japan on Apr. 13, 2020.

BACKGROUND OF THE INVENTION

1. Field of the Invention

The present invention relates to a current sensor.

2. Description of the Related Art

As a technique relating to a conventional current sensor, for example, Japanese Patent No. 5193622 discloses a current sensor integrated battery terminal. In this current sensor integrated battery terminal, in a long and thin plate-shaped conductor, a terminal holding portion and a wiring connection portion are formed, and the conductor is folded back at an intermediate portion between the terminal holding portion and the wiring connection portion to form a current sensor accommodating portion. Then, the current sensor integrated battery terminal integrally accommodates a magnetic detection element in the current sensor accommodating portion and detects a current flowing through the conductor.

By the way, the current sensor integrated battery terminal described in Japanese Patent No. 5193622 described above has room for further improvement in terms of ensuring resonance resistance performance to vehicle vibration when mounted on a vehicle, for example.

SUMMARY OF THE INVENTION

The present invention has been made in view of the above circumstances, and an object of the present invention is to provide a current sensor capable of ensuring an appropriate resonance resistance performance against vehicle vibration.

In order to achieve the above mentioned object, a current sensor according to one aspect of the present invention includes a battery terminal portion that is conductive and is fastened to a battery post that extends along a first direction; a sensor unit that is located side by side with the battery terminal portion along a second direction that intersects the first direction and is electrically connected to the battery terminal portion to detect a current; and a housing that has an insulating property and embeds the sensor unit, wherein the battery terminal portion includes a pair of plate-shaped portions, each formed in a plate shape and located so as to face each other along the first direction, and the pair of plate-shaped portions are embedded in the housing with end portions on the sensor unit side in the second direction spaced apart from each other along the first direction.

According to another aspect of the present invention, in the current sensor, it is possible to configure that the sensor unit includes a shunt resistor for current detection that is electrically connected to one of the pair of plate-shaped portions.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, an embodiment according to the present invention will be described in detail with reference to the drawings. Note that the present invention is not limited by this embodiment. In addition, components in the following embodiment include those that can be easily replaced by those skilled in the art or those that are substantially the same.

Note that in the following description, among the first direction, the second direction, and the third direction that intersect each other, the first direction is referred to as "axis direction X", the second direction is referred to as "first width direction Y", and the third direction is referred to as "second width direction Z". Here, the axis direction X, the first width direction Y, and the second width direction Z are substantially orthogonal to each other. The axis direction X typically corresponds to a direction along a central axis C (see FIG. 2 and the like) of a battery post in which the current sensor is provided, a height direction of a battery, a normal direction along a normal N (see FIG. 6) of a circuit board, and the like. The first width direction Y typically corresponds to the direction in which a battery terminal portion and a sensor unit are aligned, a short side direction of the battery, and the like. The second width direction Z typically corresponds to a tightening direction of the battery terminal portion, a long side direction of the battery, and the like. Typically, with the current sensor installed in the vehicle and the vehicle located in the horizontal plane, the axis direction X is along a vertical direction, and the first width direction Y and the second width direction Z are along a horizontal direction. Respective directions used in the following description refer to directions in a state where respective portions are assembled to each other unless otherwise specified.

EMBODIMENT

Figure 1:
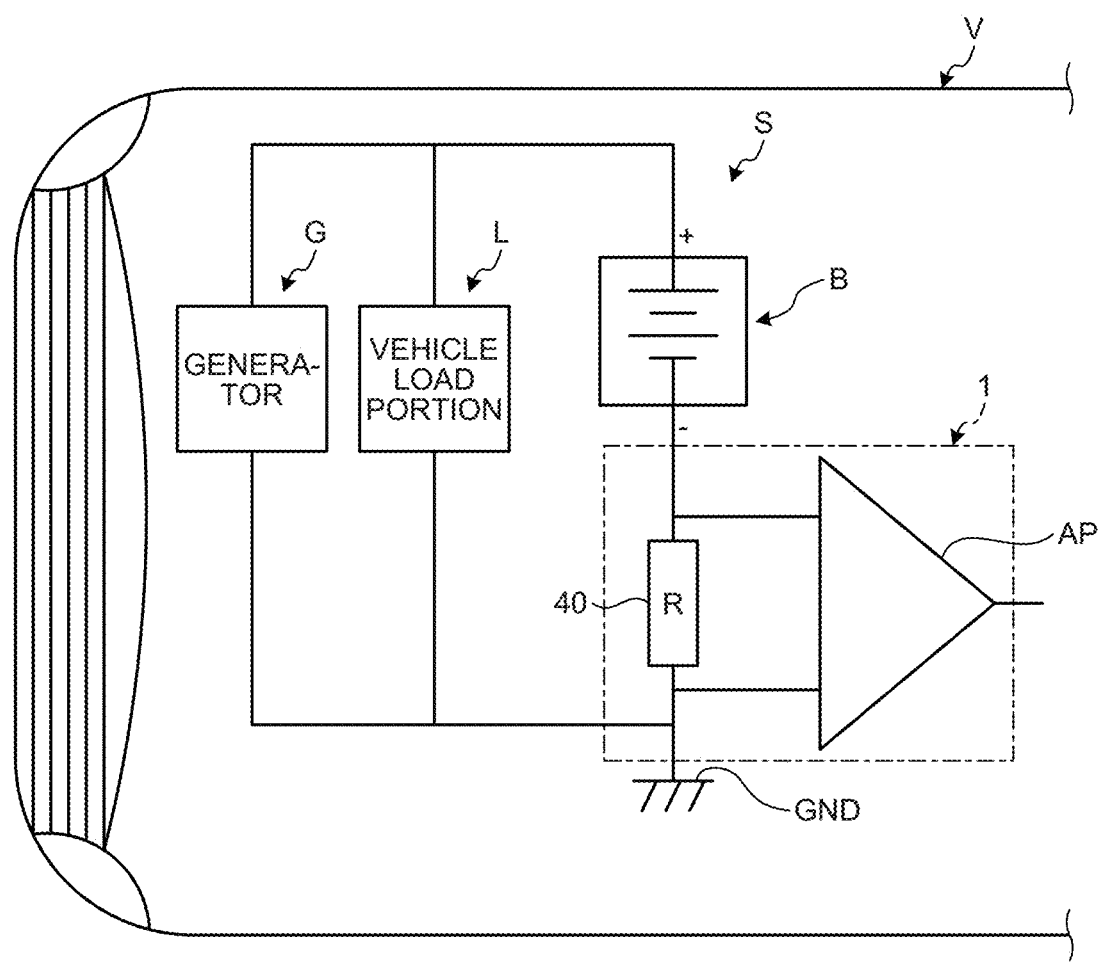
FIG. 1 is a circuit diagram illustrating a schematic configuration of a current sensor according to an embodiment.
Figure 2:
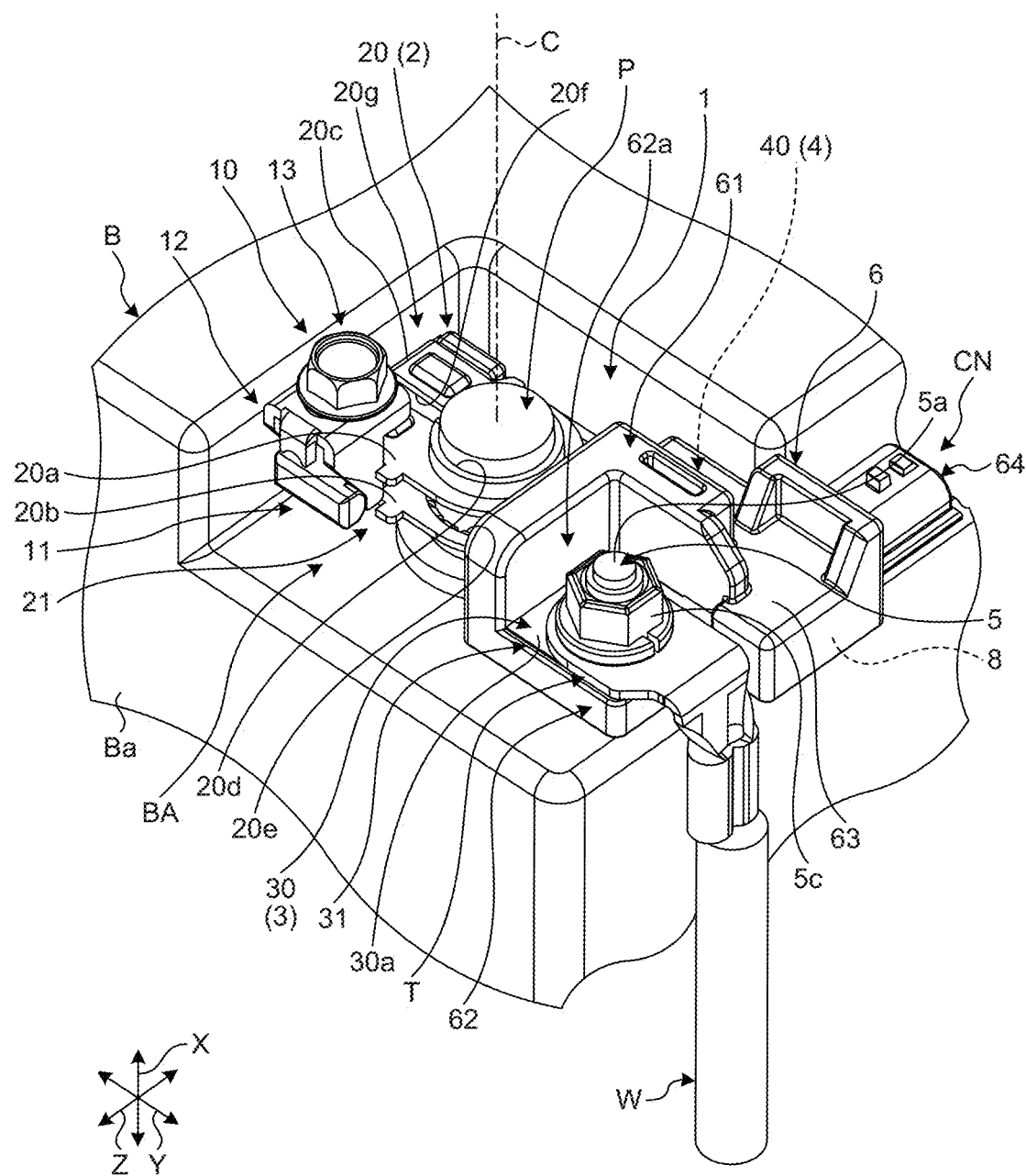
FIG. 2 is a perspective view illustrating a schematic configuration of the current sensor according to the embodiment.
Figure 3:
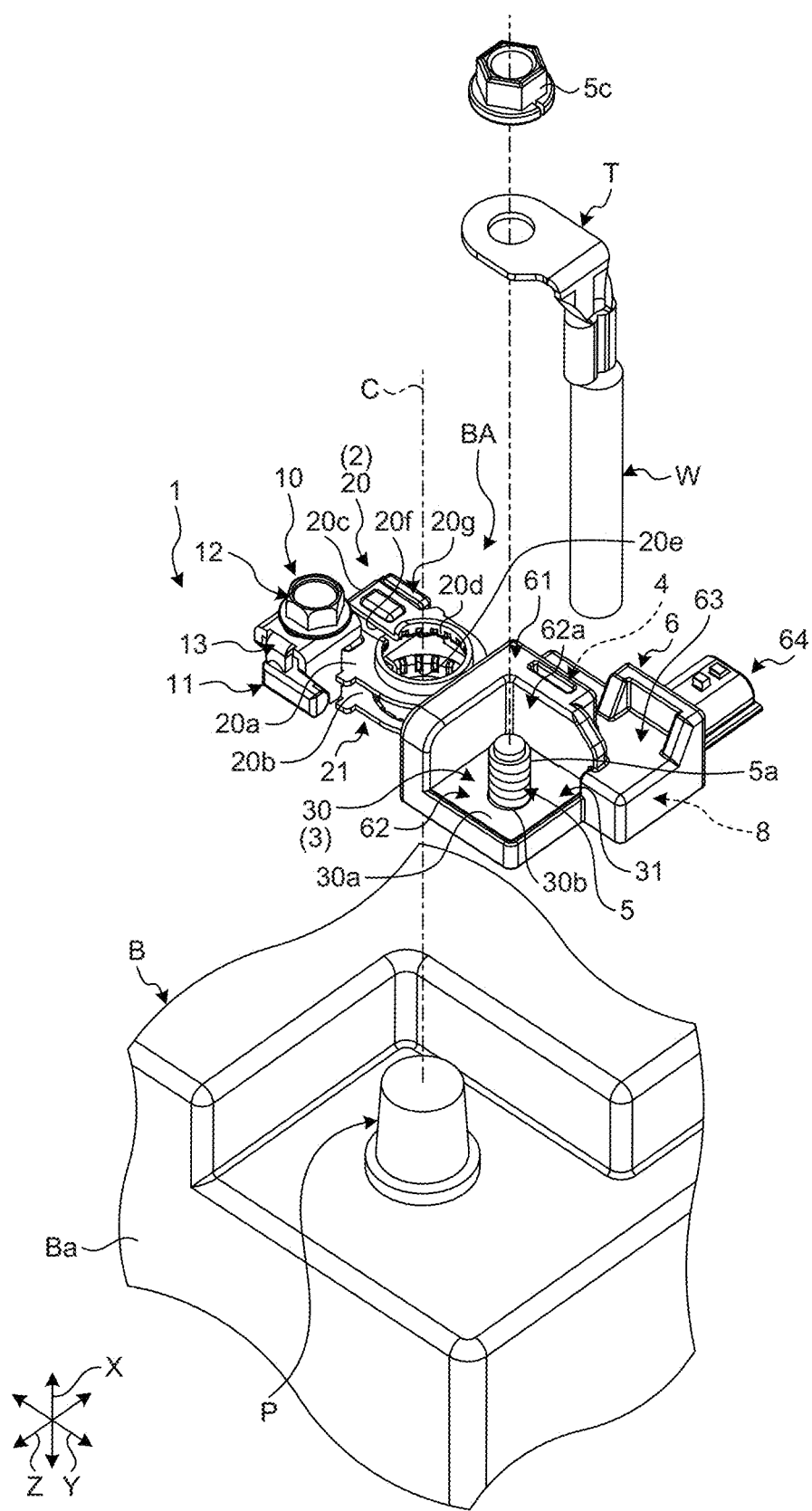
FIG. 3 is an exploded perspective view illustrating a schematic configuration of the current sensor according to the embodiment.
Figure 4:
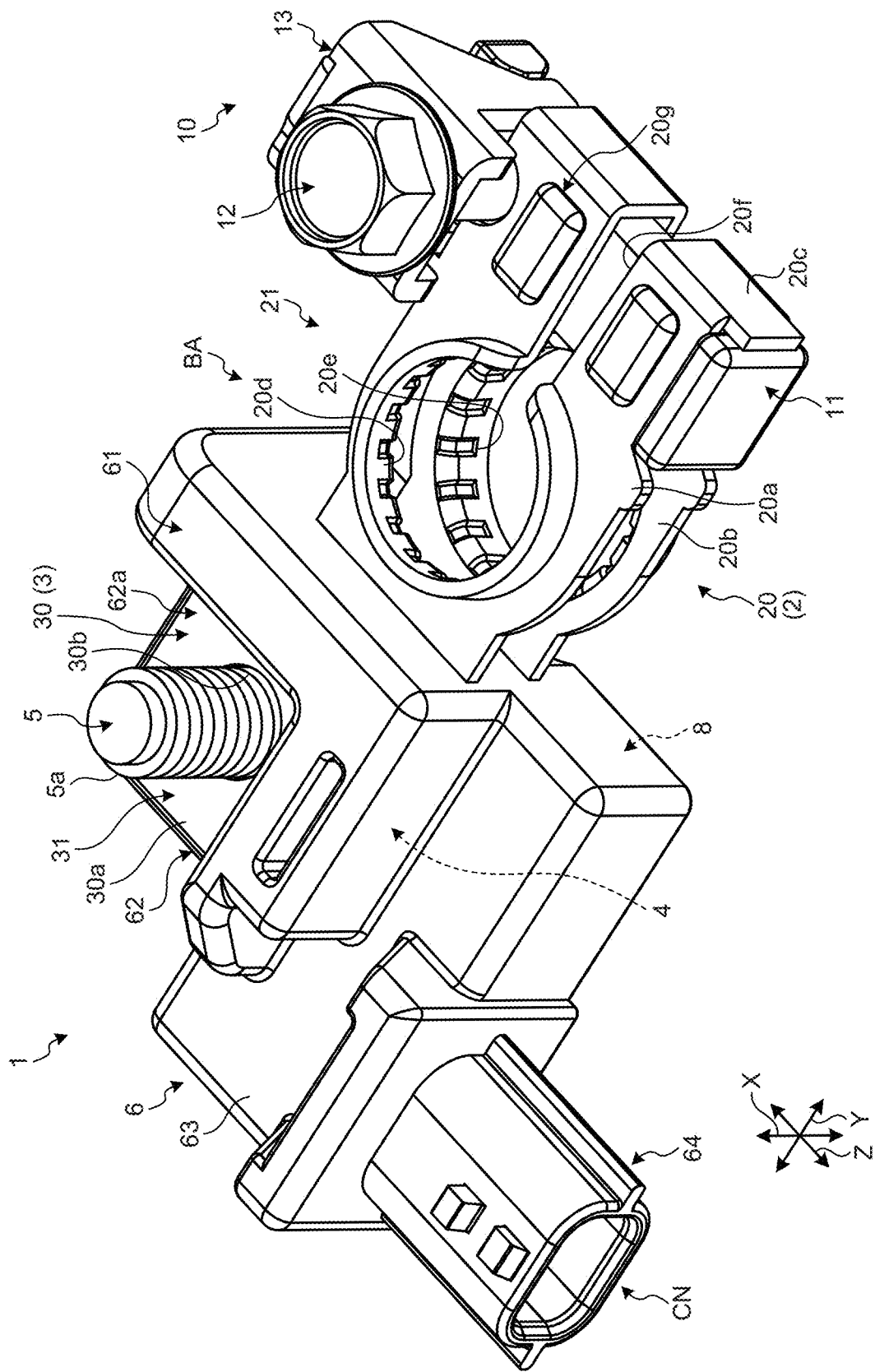
FIG. 4 is a perspective view illustrating a schematic configuration of the current sensor according to the embodiment.

A current sensor 1 of the present embodiment illustrated in FIGS. 1, 2, and 3 is a sensor for measuring a charge/discharge current of a battery B mounted on a vehicle V. In a power supply system S of the vehicle V including the battery B, in recent years, the consumption of the battery B tends to increase relatively with an increase in the types, numbers, and the like of electrical components of the vehicle V, and in order to deal with such a tendency, there is a request to monitor a state of the battery B more appropriately. In order to respond to such a request, the power supply system S detects the charge/discharge current of the battery B by the current sensor 1, and monitors the remaining capacity of the battery B, detects the consumption (deterioration degree) of the battery B, performs fuel consumption improvement processing by controlling an operation of a generator G such as an alternator, and the like based on the detected current (current value).

The current sensor 1 of the present embodiment is configured to have a battery mounting structure, and here, a battery terminal integrated sensor integrated with a battery terminal (battery terminal portion 2) is configured. Here, the battery B is mounted on the vehicle V as a power storage device. In the battery B, a battery post P is erected in a battery housing Ba that houses a battery fluid and various components. The battery post P is a lead electrode and is erected on one surface of the battery housing Ba, typically on a surface located on an upper side in a vertical direction with the battery B mounted on the vehicle V. The battery post P projects from the surface of the upper side in the vertical direction of the battery housing Ba toward the upper side in the vertical direction. The battery post P is formed in a columnar shape, more specifically, a columnar shape tapered so that a diameter decreases toward a tip side. The battery post P is arranged so that the central axis C is in the vertical direction, here along the axis direction X, and extends in a columnar shape along the axis direction X. A total of two battery posts P are provided in one battery B, one as a positive electrode (plus (+) electrode) and one as a negative electrode (minus (−) electrode) (only one side is illustrated in FIGS. 2, 3, etc.).

The current sensor 1 constituting the battery terminal integrated sensor is fastened to the battery post P configured as described above. The current sensor 1 of the present embodiment is provided in the battery post P on the negative electrode side of the battery B, and is interposed between the battery B and the generator G, a vehicle load portion L, a ground portion (vehicle body, etc.) GND, and the like, and detects the current flowing between the battery post P and these components. Here, the current sensor 1 is fastened to the battery post P on the negative electrode side and electrically connected to the battery post P, and is electrically connected to a connection terminal T provided at an end of an electric wire (for example, a ground wire) W on the ground portion GND side. Then, the current sensor 1 is interposed between the connection terminal T and the battery post P, electrically connects them to each other, and then detects the current flowing between the connection terminal T and the battery post P.

Figure 5:
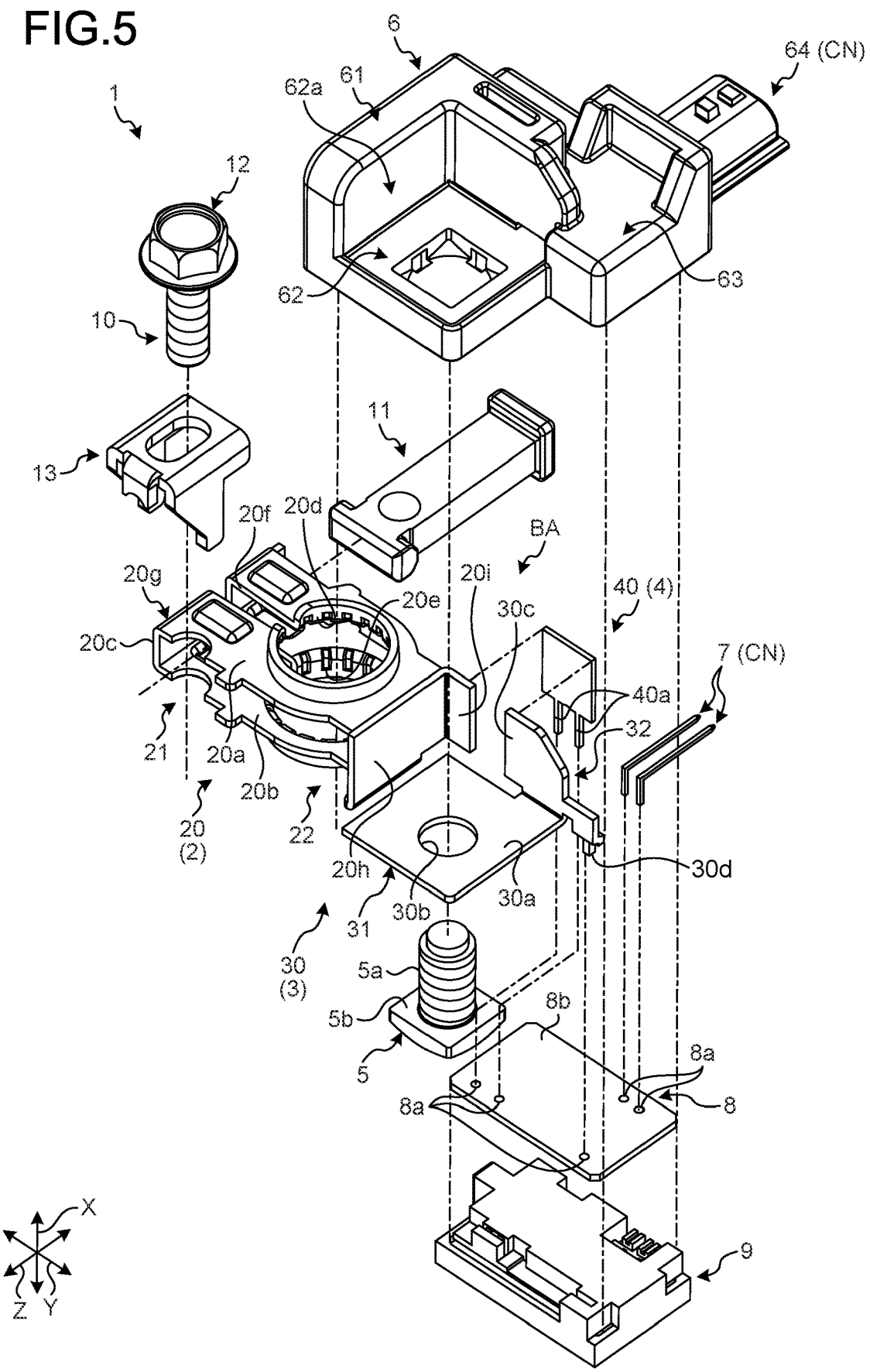
FIG. 5 is an exploded perspective view illustrating a schematic configuration of the current sensor according to the embodiment.

The current sensor 1 of the present embodiment is a so-called shunt type current sensor. That is, the current sensor 1 passes a current through a shunt resistor 40 (see also FIG. 5 and the like), and measures a current value from a voltage drop when energized and a resistance value of the shunt resistor 40 using Ohm's law. The current sensor 1 typically amplifies and outputs a voltage (detection voltage) generated across the shunt resistor 40 according to the current flowing through the shunt resistor 40 by an amplifier AP, and detects the current flowing through the shunt resistor 40 and based on the output of the amplifier AP. For example, compared with a magnetic detection type current sensor using so-called Hall IC etc., the shunt type current sensor 1 has advantages that a selection range of electronic components is wide and it is possible to flexibly response to higher accuracy and lower price, temperature characteristics are good by using an alloy with little temperature change as the shunt resistor 40, it is less affected by external magnetic field, a core/shield plate or the like is not required and the weight is light, and the like.

Then, in the current sensor 1 of the present embodiment, by embedding a pair of plate-shaped portions 20a and 20b of a battery terminal portion 2 fastened to the battery post P as described above in a housing 6 with end portions 20aa and 20ba spaced apart from each other, it is possible to secure an appropriate resonance resistance performance against vehicle vibration. Hereinafter, each configuration of the current sensor 1 will be described in detail with reference to each figure.

Specifically, as illustrated in FIGS. 2, 3, 4, 5, and 6, the current sensor 1 includes the battery terminal portion 2, a terminal connection portion 3, a sensor unit 4, a stud bolt 5, the housing 6, an output terminal 7, a circuit board 8, a mold material 9, and a tightening mechanism 10. In the following, each portion of the current sensor 1 will be described mainly with reference to FIGS. 2, 3, 4, 5, and 6, as appropriate, with reference to FIGS. 7, 8, and 9.

The battery terminal portion 2, the terminal connection portion 3, and the sensor unit 4 are integrated to form a bus bar assembly BA. In other words, it can be said that the current sensor 1 includes the bus bar assembly BA. The bus bar assembly BA includes a BT bus bar 20, a GND bus bar 30, and the shunt resistor 40, and these are integrally configured. The BT bus bar 20 is a first bus bar that constitutes the battery terminal portion 2. The GND bus bar 30 is a second bus bar that constitutes the terminal connection portion 3. The shunt resistor 40 is a resistor for current detection that is electrically connected to the BT bus bar 20 and the GND bus bar 30 and constitutes the sensor unit 4.

The BT bus bar 20, the GND bus bar 30, and the shunt resistor 40 are plate-shaped metal conductors having conductivity. The BT bus bar 20, the GND bus bar 30, and the shunt resistor 40 are subjected to various processing to be formed into shapes corresponding to the battery terminal portion 2, the terminal connection portion 3, and the sensor unit 4, respectively. The BT bus bar 20 and the GND bus bar 30 are made of a metal having good conductivity, for example, copper (Cu) or a copper alloy. On the other hand, the shunt resistor 40 is made of a dissimilar metal different from the BT bus bar 20 and the GND bus bar 30, for example, copper/manganese/nickel (Cu—Mn—Ni)-based alloys, copper/nickel (Cu—Ni)-based alloys, nickel-chromium (Ni—Cr)-based alloys, and the like with good temperature characteristics, whose resistance value does not easily fluctuate according to temperature.

The battery terminal portion 2 is a portion that has conductivity and is fastened to the battery post P, and is configured by the above-mentioned BT bus bar 20. The battery terminal portion 2 includes a main body portion 21 and an electrode portion 22. In the battery terminal portion 2, for example, the main body portion 21 and the electrode portion 22 are integrally formed by subjecting the BT bus bar 20 to press bending or the like.

The main body portion 21 is a main portion to be fastened to the battery post P. The main body portion 21 includes the pair of plate-shaped portions 20a and 20b, and a bending connection portion 20c. The pair of plate-shaped portions 20a and 20b are formed in a substantially rectangular annular shape and a plate shape, each having various uneven shapes and notch shapes. The plate-shaped portions 20a and 20b have a plate thickness direction extending along the axis direction X, and along the first width direction Y and the second width direction Z. The pair of plate-shaped portions 20a and 20b are located so as to face each other along the axis direction X in a state of being spaced along the axis direction X. In the main body portion 21, the plate-shaped portion 20a is located on the upper side in the vertical direction (opposite to the installation surface of the battery post P) in the state of being fastened to the battery post P, and the plate-shaped portion 20b is located on the lower side in the vertical direction (the installation surface side of the battery post P). The plate-shaped portion 20a and the plate-shaped portion 20b are integrally formed so that the ends on one side of the first width direction Y (the side opposite to the electrode portion 22 side) are continuous via the bending connection portion 20c. As a result, the main body portion 21 is formed in a state of being folded back in a substantially U shape as a whole with the bending connection portion 20c sandwiched therein, and the plate-shaped portion 20a and the plate-shaped portion 20b face each other in the axis direction X, and are stacked in a plate shape substantially parallel to each other in the vertical direction.

The pair of plate-shaped portions 20a and 20b are formed in a substantially rectangular annular shape as described above by forming post insertion holes 20d and 20e, respectively. The post insertion holes 20d and 20e are holes into which the battery post P is inserted, and penetrate through the plate-shaped portions 20a and 20b along the axis direction X, respectively. The post insertion holes 20d and 20e are formed in a substantially circular shape according to an outer diameter shape of the battery post P. The post insertion hole 20d and the post insertion hole 20e are formed in a positional relationship in which the pair of plate-shaped portions 20a and 20b face each other along the axis direction X in a state of being stacked vertically via the bending connection portion 20c. The post insertion holes 20d and 20e have a taper corresponding to the taper of the battery post P formed on each inner peripheral wall surface, and each inner peripheral wall surface comes into contact with the battery post P with the battery post P inserted.

Then, in the main body portion 21, a slit (gap) 20f is formed over the pair of plate-shaped portions 20a and 20b and the bending connection portion 20c. The slit 20f extends along the first width direction Y at the end of the pair of plate-shaped portions 20a and 20b on the bending connection portion 20c side and is continuous with the post insertion holes 20d and 20e, and extends along the axis direction X at the bending connection portion 20c. In other words, the slit 20f is formed to extend from the post insertion holes 20d and 20e to the bending connection portion 20c so as to divide a part of the plate-shaped portions 20a and 20b. In the main body portion 21, the portion where the slit 20f is formed at the end of the pair of plate-shaped portions 20a and 20b on the bending connection portion 20c side constitutes a tightening end portion 20g. The tightening end portion 20g is a portion that is tightened by the tightening mechanism 10 when the battery terminal portion 2 is fastened to the battery post P.

The electrode portion 22 is located side by side with the main body portion 21 along the first width direction Y, and is a portion to which the shunt resistor 40 is joined. The electrode portion 22 is one of the pair of plate-shaped portions 20a and 20b, and here, the electrode portion 22 is integrally and electrically connected with the plate-shaped portion 20b (see FIG. 7). The electrode portion 22 includes an extension portion 20h and a joint piece portion 20i. The extension portion 20h is formed in a plate shape so as to be folded back along the axis direction X from the end portion 20ba (see FIG. 7) of the plate-shaped portion 20b in the first width direction Y. The extension portion 20h extends in the plate thickness direction along the first width direction Y, along the axis direction X, and along the second width direction Z. The extension portion 20h is formed by being bent substantially perpendicularly to one side along the axis direction X from the end portion 20ba of the plate-shaped portion 20b. The extension portion 20h extends from the end portion 20ba of the plate-shaped portion 20b toward the plate-shaped portion 20a along the axis direction X, and is positioned at a distance from an end surface of the end portion 20aa of the plate-shaped portion 20a. The joint piece portion 20i is formed in a plate shape so as to be folded back along the first width direction Y from an end portion of one side of the extension portion 20h in the second width direction Z. The joint piece portion 20i has a plate thickness direction extending along the second width direction Z, along the axis direction X, and along the first width direction Y. The joint piece portion 20i is formed by being bent substantially perpendicularly from the end portion of the extension portion 20h to the side opposite to the main body portion 21 side along the first width direction Y.

The terminal connection portion 3 has conductivity and is a portion to which the connection terminal T of the electric wire W is electrically connected, and is configured by the above-mentioned GND bus bar 30. The terminal connection portion 3 is located side by side with the battery terminal portion 2 at intervals along the first width direction Y, and includes a fastening portion 31 and an electrode portion 32. In the terminal connection portion 3, for example, the fastening portion 31 and the electrode portion 32 are integrally formed by subjecting the GND bus bar 30 to press bending or the like.

The fastening portion 31 is a portion where the connection terminal T is fastened and electrically connected. The fastening portion 31 includes a plate-shaped portion 30a. The plate-shaped portion 30a is formed in a substantially rectangular plate shape, and is electrically connected to the ground portion GND or the like via the stud bolt 5, the connection terminal T, the electric wire W, or the like to be grounded. The plate-shaped portion 30a has a plate thickness direction extending along the axis direction X, and along the first width direction Y and the second width direction Z. A bolt insertion hole 30b is formed in the plate-shaped portion 30a. The bolt insertion hole 30b is a hole into which a shaft portion 5a of the stud bolt 5 is inserted, and penetrates through the plate-shaped portion 30a along the axis direction X.

Here, the stud bolt 5 is a fastening member that fastens the fastening portion 31 of the terminal connection portion 3 and the connection terminal T to electrically connect the fastening portion 31 and the connection terminal T. The stud bolt 5 is formed so that the shaft portion 5a protrudes from a base portion 5b. The stud bolt 5 fastens the fastening portion 31 of the terminal connection portion 3 and the connection terminal T to make a conductive connection by screwing a nut 5c into the shaft portion 5a in a state where the shaft portion 5a is inserted into the bolt insertion hole 30b and the connection terminal T is assembled.

The electrode portion 32 is located side by side with the electrode portion 22 of the battery terminal portion at intervals along the first width direction Y, and is a portion to which the shunt resistor 40 is joined. The electrode portion 32 is integrated with the plate-shaped portion 30a and is electrically connected. The electrode portion 32 includes a joint piece portion 30c and a ground terminal portion 30d. The joint piece portion 30c is formed in a plate shape so as to be folded back along the axis direction X from an end portion of one side of the plate-shaped portion 30a in the second width direction Z. The joint piece portion 30c has a plate thickness direction extending along the second width direction Z, along the axis direction X, and along the first width direction Y. The joint piece portion 30c is formed by being bent substantially perpendicularly from the end portion of the plate-shaped portion 30a to one side (the same side as the extension portion 20h of the electrode portion 22) along the axis direction X. The ground terminal portion 30d extends from the joint piece portion 30c to one side in the first width direction Y, and is formed by being bent toward the plate-shaped portion 30a along the axis direction X. The bent end portion of the ground terminal portion 30d is formed in a tab shape along the axis direction X. The ground terminal portion 30d is electrically connected to the circuit board 8 to electrically connect and ground the circuit board 8 to the ground portion GND or the like via the joint piece portion 30c, the plate-shaped portion 30a, the stud bolt 5, the connection terminal T, the electric wire W, and the like.

The sensor unit 4 is a portion that is located side by side with the battery terminal portion 2 along the first width direction Y, is electrically connected to the battery terminal portion 2, and detects a current. Here, the sensor unit 4 is located between the battery terminal portion 2 and the terminal connection portion 3 along the first width direction Y. The sensor unit 4 of the present embodiment constitutes a shunt type sensor unit, and includes the above-mentioned shunt resistor 40.

The shunt resistor 40 is formed in a plate shape, and is electrically connected to one of the pair of plate-shaped portions 20a and 20b of the battery terminal portion 2, here, the plate-shaped portion 20b via the electrode portion 22. The shunt resistor 40 is located between the joint piece portion 20i and joint piece portion 30c in a state in which the end surface of the joint piece portion 20i of the electrode portion 22 of the battery terminal portion 2 and the end surface of the joint piece portion 30c of the electrode portion 32 of the terminal connection portion 3 face each other along the first width direction Y. Then, the shunt resistor 40 is joined to the joint piece portion 20i and the joint piece portion 30c. In such a sensor unit 4, the joint piece portion 20i of the battery terminal portion 2 serves as an electrode (the electrode on the negative electrode side of the battery B) on one side to which the shunt resistor 40 is joined, and the joint piece portion 30c of the terminal connection portion 3 serves as an electrode (the electrode on the ground portion GND side) on the other side to which the shunt resistor 40 is joined.

The shunt resistor 40 is formed in a substantially rectangular plate shape, and a plate thickness direction extends along the second width direction Z, along the axis direction X, and the first width direction Y. Then, both end portions of the shunt resistor 40 in the first width direction Y are joined and electrically connected to the joint piece portion 20i and the joint piece portion 30c by various joining means such as laser welding, electron beam welding, and brazing. With such a configuration, the shunt resistor 40 is electrically connected to the BT bus bar 20 that constitutes the battery terminal portion 2 and the GND bus bar 30 that constitutes the terminal connection portion 3.

The shunt resistor 40 includes a pair of terminal portions 40a on the end surface in the axis direction X. The pair of terminal portions 40a are output terminals that output a voltage (potential difference) generated between the end portion on the joint piece portion 20i side and the end portion of the joint piece portion 30c side of the shunt resistor 40 according to the current flowing through the shunt resistor 40 to the circuit board 8. The pair of terminal portions 40a are located on one end surface of the shunt resistor 40 in the axis direction X at intervals along the first width direction Y, and protrude from the end surface along the axis direction X to be formed in a tab shape. The shunt resistor 40 outputs a voltage (potential difference) generated at both end portions to the circuit board 8 when the pair of terminal portions 40a are electrically connected to the circuit board 8.

The housing 6 is a protective member that has an insulating property, and embeds and protects the sensor unit 4 (shunt resistor 40), the output terminal 7, the circuit board 8, and the like. The housing 6 is made of, for example, a polyphenylene sulfide (PPS) resin having an insulating property and a high heat resistance. In addition, the resin such as PPS contains glass fiber in order to increase strength of the housing 6. The housing 6 is integrally molded with the bus bar assembly BA, the stud bolt 5, the output terminal 7, etc. by, for example, insert molding, and then the circuit board 8 is assembled inside.

For example, the bus bar assembly BA is inserted (set) together with the output terminal 7 in the mold for insert molding of the housing 6, in a state in which the BT bus bar 20, the GND bus bar 30, and the shunt resistor 40 are integrated, and the stud bolt 5 is assembled in the bolt insertion hole 30b. Then, the housing 6 is formed by injecting an insulating resin into the mold and forming the housing 6 integrally with the bus bar assembly BA, the stud bolt 5, the output terminal 7, and the like.

The housing 6 exposes a portion of the bus bar assembly BA, the stud bolt 5, and the output terminal 7 to the outside in a state of embedding the bus bar assembly BA, the stud bolt 5, and the output terminal 7 therein. Specifically, the housing 6 includes a sensor cover portion 61, a bolt holding portion 62, a board cover portion 63, and a connector housing portion 64, and these are integrally formed.

The sensor cover portion 61 is a portion in which a shunt resistor 40 constituting the sensor unit 4 is embedded and covers and protects the shunt resistor 40. Here, the sensor cover portion 61 is embedded with the entire shunt resistor 40 of the sensor unit 4, the entire electrode portion 22 of the battery terminal portion 2, and the entire electrode portion 32 of the terminal connection portion 3 to cover and protect them. The sensor cover portion 61 is formed in a substantially L-shape when viewed along the axis direction X in accordance with a series of shapes of the electrode portion 22, the shunt resistor 40, and the electrode portion 32.

Figure 7:
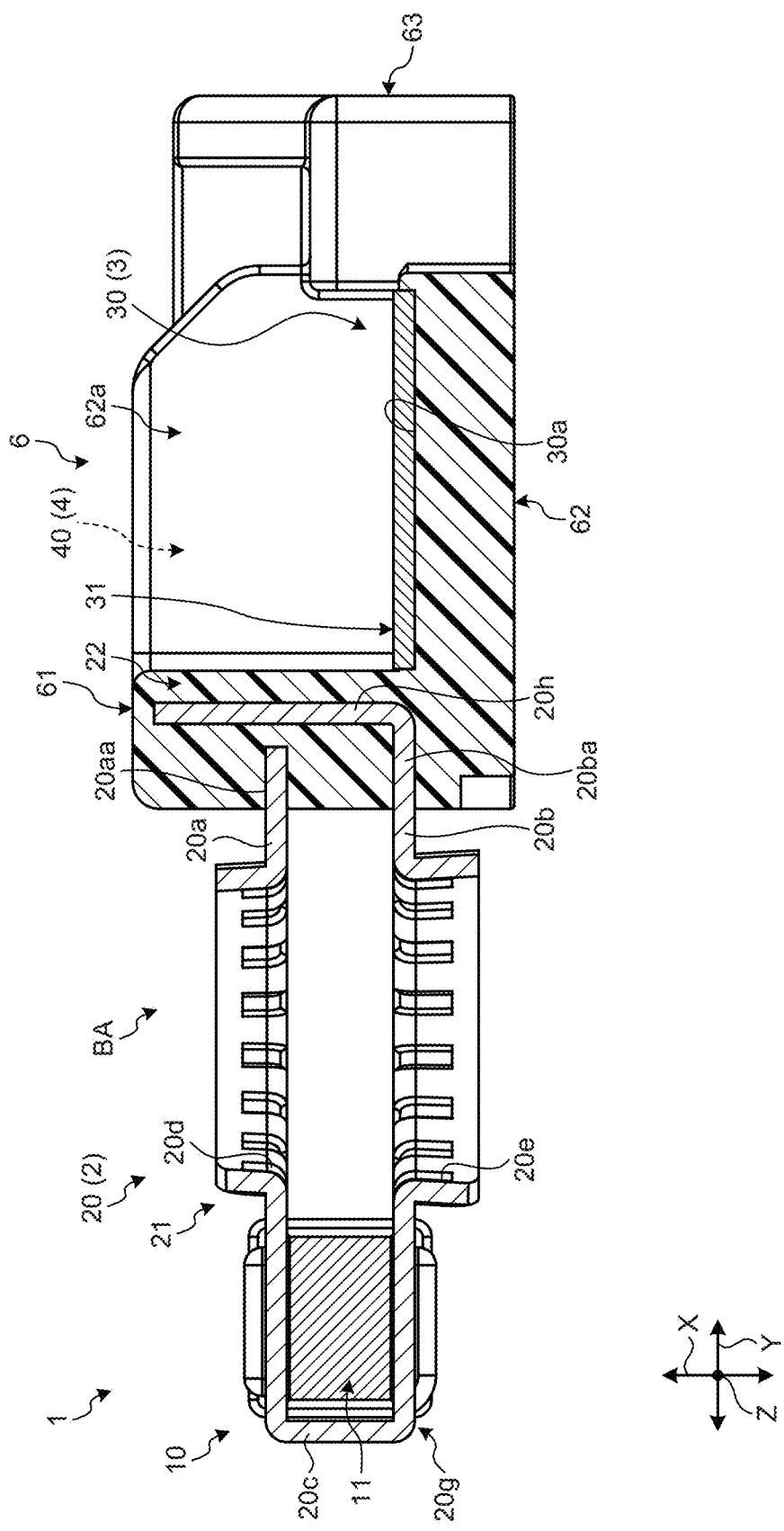
FIG. 7 is a cross-sectional view illustrating a schematic configuration of the current sensor according to the embodiment.
Figure 8:
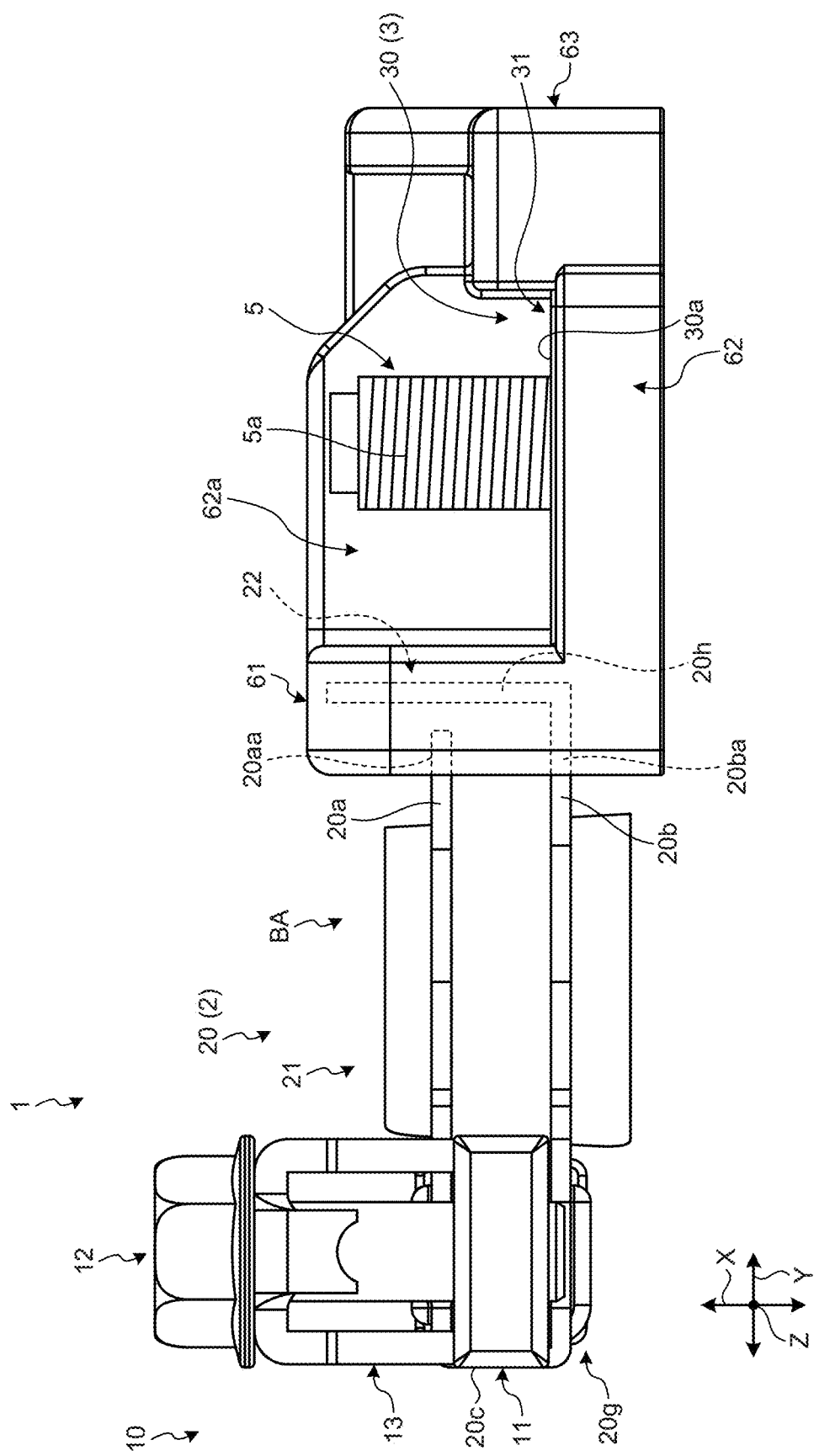
FIG. 8 is a side view illustrating a schematic configuration of the current sensor according to the embodiment.

As illustrated in FIGS. 7 and 8, the housing 6 exposes most of the main body portion 21 constituting the battery terminal portion 2 to the outside, and then the end portions 20aa and 20ba on the electrode portion 22 side of the plate-shaped portions 20a and 20b constituting the main body portion 21 are also embedded and integrated inside the sensor cover portion 61.

More specifically, as illustrated in FIGS. 7 and 8, in the housing 6 of the present embodiment, the end portions 20aa and 20ba of the pair of plate-shaped portions 20a and 20b constituting the main body portion 21 are embedded inside the sensor cover portion 61. That is, in the pair of plate-shaped portions 20a and 20b, the end portions 20aa and 20ba on the sensor unit 4 side in the first width direction Y are both embedded and integrated inside the sensor cover portion 61 of the housing 6. Here, the end portions 20aa and 20ba are portions located closer to the electrode portion 22 (sensor unit 4) side than the post insertion holes 20d and 20e with respect to the first width direction Y in the plate-shaped portions 20a and 20b, respectively, and are here formed as a substantially rectangular end portion.

The pair of plate-shaped portions 20a and 20b of the present embodiment are embedded in the sensor cover portion 61 of the housing 6 in a state where the end portions 20aa and 20ba are spaced apart along the axis direction X. Here, the end portions 20aa and 20ba of the plate-shaped portions 20a and 20b are integrated with the sensor cover portion 61 so as to pierce the sensor cover portion 61 linearly along the first width direction Y, and in the state, they are located to face each other at intervals along the axis direction X.

The bolt holding portion 62 is a portion in which the stud bolt 5 inserted into the bolt insertion hole 30b of the terminal connection portion 3 is embedded and held. The bolt holding portion 62 is provided at a position adjacent to the sensor cover portion 61 along the first width direction Y and at a position inside the sensor cover portion 61 formed in a substantially L-shape. The bolt holding portion 62 is formed so as to have a step with respect to the sensor cover portion 61 along the axis direction X. Here, the bolt holding portion 62 exposes one surface of the plate-shaped portion 30a of the terminal connection portion 3 and the shaft portion 5a of the stud bolt 5 along one side in the axis direction X, and the plate-shaped portion 30a and the base portion 5b of the stud bolt 5 are embedded in the bolt holding portion 62 to be covered and protected. The bolt holding portion 62 is formed in a substantially rectangular shape when viewed along the axis direction X in accordance with the shapes of the plate-shaped portion 30a and the base portion 5b of the stud bolt 5. One surface of the plate-shaped portion 30a and the shaft portion 5a of the stud bolt 5 exposed from the bolt holding portion 62 are exposed to a space portion 62a surrounded by the sensor cover portion 61 and the bolt holding portion 62. The space portion 62a is formed according to the step between the sensor cover portion 61 and the bolt holding portion 62, and the connection terminal T and the nut 5c to be assembled to the shaft portion 5a of the stud bolt 5 are located.

The board cover portion 63 is a portion that accommodates the circuit board 8 inside and covers and protects the circuit board 8. The board cover portion 63 is located at a position adjacent to the sensor cover portion 61 along the first width direction Y and the second width direction Z, and is provided at a position opposite to the bolt holding portion 62 with the sensor cover portion 61 interposed therebetween in the second width direction Z. The board cover portion 63 is formed so as to have a step with respect to the sensor cover portion 61 along the axis direction X, similarly to the bolt holding portion 62. The board cover portion 63 is formed in a substantially rectangular shape when viewed along the axis direction X in accordance with the shape of the circuit board 8 formed in the substantially rectangular plate shape.

Figure 9:
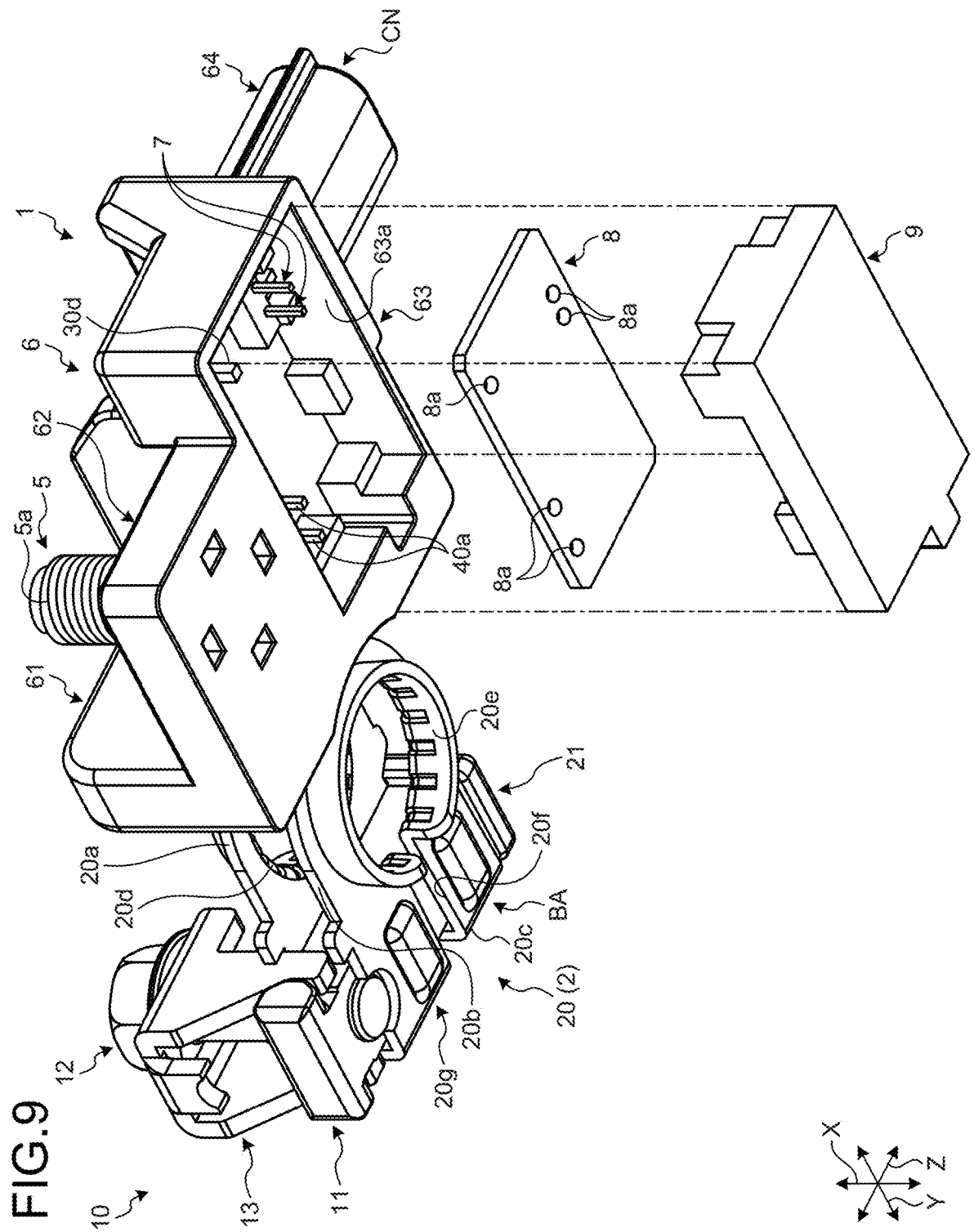
FIG. 9 is an exploded perspective view illustrating a schematic configuration of the current sensor according to the embodiment.

As illustrated in FIG. 9, the board cover portion 63 is formed with an installation opening 63a for assembling the circuit board 8 inside the board cover portion 63 after the housing 6 is molded. The installation opening 63a is formed as a space portion of a substantially rectangular shape according to the shape of the circuit board 8, and is opened toward one side in the axis direction X (the side opposite to the side on which the shaft portion 5a of the stud bolt 5 protrudes). In the installation opening 63a, the ground terminal portion 30d of the terminal connection portion 3, the terminal portion 40a of the shunt resistor 40, and the end portion of the output terminal 7 are exposed. The installation opening 63a is sealed by the mold material 9 after the circuit board 8 is assembled inside the board cover portion 63.

The connector housing portion 64 is a portion that constitutes a connector portion CN together with the output terminal 7. The connector housing portion 64 is formed so as to protrude from the board cover portion 63 to one side (opposite to the bolt holding portion 62 side) along the second width direction Z. The connector housing portion 64 is formed in a tubular shape that opens on one side in the second width direction Z, and holds the output terminal 7 so as to expose the end portion of the output terminal 7 inside.

The output terminal 7 is a terminal that is electrically connected to the circuit board 8 and outputs a sensor output detected by the sensor unit 4 to the outside. Here, the output terminal 7 has conductivity and is configured by a pair of bent terminals formed in a substantially L-shape. As described above, the output terminal 7 is embedded and integrated inside the connector housing portion 64 by insert molding. With the output terminal 7 embedded in the connector housing portion 64, one end portion thereof is exposed in the connector housing portion 64 along the second width direction Z, and the other end portion is exposed in the above-mentioned installation opening 63a along the axis direction X. The connector portion CN configured by the connector housing portion 64 and the output terminal 7 is electrically connected to a mating connector by fitting the connector to the mating connector, and electrically connects an output destination of the sensor output, for example, a higher-level ECU in the vehicle V and the circuit board 8.

The circuit board 8 is a board on which electronic components are mounted to constitute an electronic circuit. The circuit board 8 is electrically connected to the shunt resistor 40, and electronic components that realize various functions such as the above-mentioned amplifier AP (see FIG. 1) are mounted. The circuit board 8 is configured by, for example, a so-called printed circuit board (PCB). On the circuit board 8, a circuit body is configured by a wiring pattern by printing the wiring pattern (printed pattern) on an insulating layer made of an insulating material such as epoxy resin, glass epoxy resin, paper epoxy resin or ceramic by using a conductive material such as copper. The circuit board 8 is formed in a substantially rectangular plate shape, and has a plate thickness direction extending along the axis direction X, the first width direction Y, and the second width direction Z, in a state of being accommodated inside the board cover portion 63.

Figure 6:
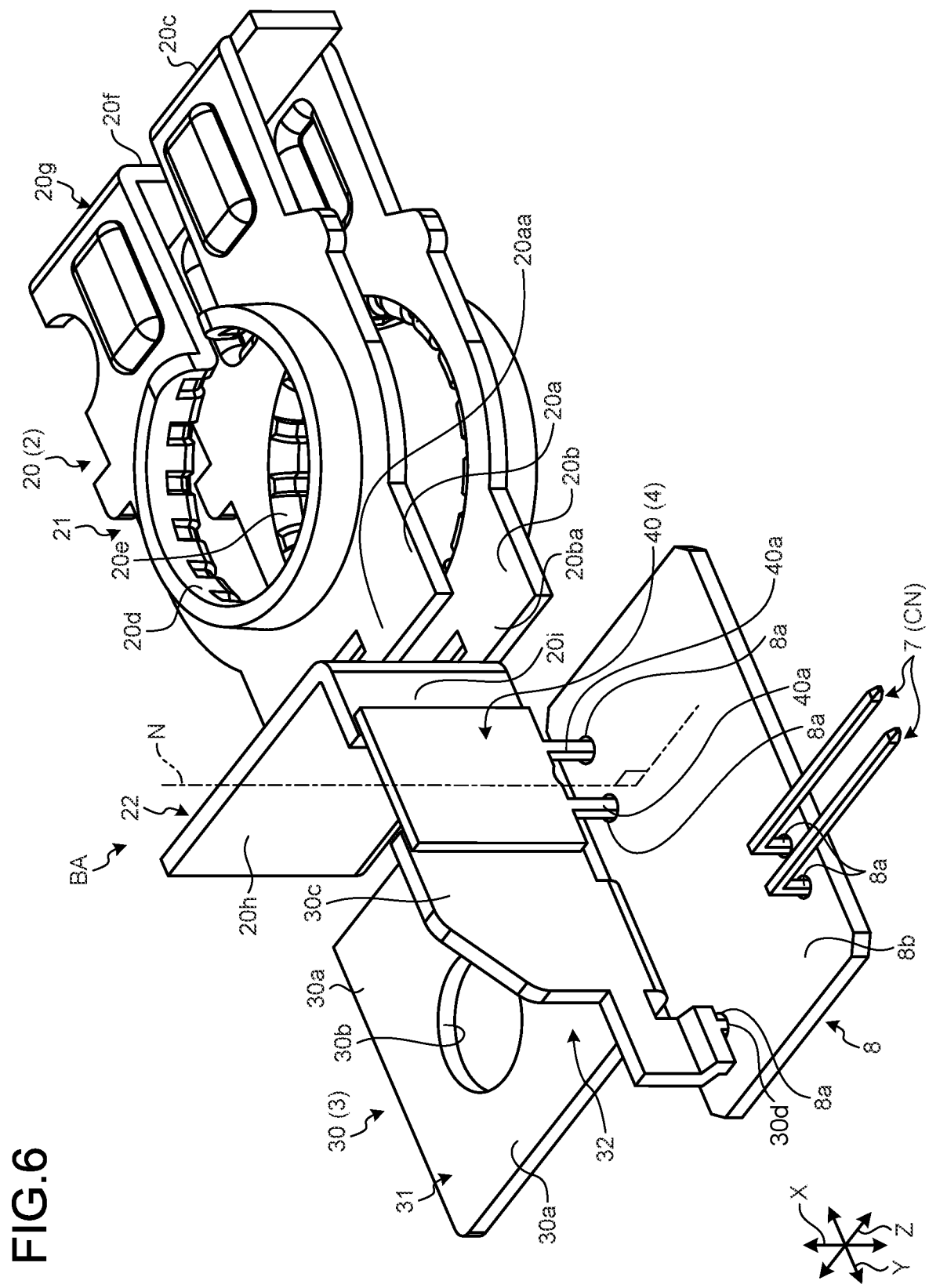
FIG. 6 is an exploded perspective view illustrating a schematic configuration of a bus bar assembly of the current sensor according to the embodiment.

The circuit board 8 has a plurality of through holes 8a penetrating along the axis direction X. As illustrated in FIG. 9, the circuit board 8 is assembled in the board cover portion 63 via the installation opening 63a described above. In this case, in the circuit board 8, the ground terminal portion 30d of the terminal connection portion 3, the terminal portion 40a of the shunt resistor 40, the output terminal 7, and the like are inserted into the plurality of through holes 8a along the axis direction X, and are assembled in the board cover portion 63. The circuit board 8 configures an electronic circuit that electrically connects the ground terminal portion 30d of the terminal connection portion 3, the terminal portion 40a of the shunt resistor 40, the output terminal 7, and the like, inserted through the through holes 8a by soldering them to the circuit body. Here, as illustrated in FIG. 6 and the like, in the circuit board 8, the normal N of a main surface 8b on one side of the axis direction X is along the axis direction X, and the shunt resistor 40 is erected on the main surface 8b along the normal direction (here, the axis direction X). Then, the installation opening 63a is sealed by the mold material 9 by being filled with the mold material 9 after the circuit board 8 is assembled inside the board cover portion 63. The mold material 9 is typically made of a resin material that is softer than the resin material that constitutes the housing 6. The mold material 9 is made of, for example, a urethane resin having an insulating property and a high adhesiveness.

The voltage (potential difference) generated at both end portions of the shunt resistor 40 is input to the circuit board 8 via the pair of terminal portions 40a connected as described above. The circuit board 8 may amplify the input voltage (detection voltage) by the amplifier AP and output the amplified detection voltage itself to the higher-level ECU via the output terminal 7 (analog output). In this case, the higher-level ECU calculates the current value based on the input detection voltage. Or, on the circuit board 8, a microcomputer may be mounted as an electronic component, a current value may be calculated by the microcomputer based on the detection voltage amplified by the amplifier AP, and a detection signal representing the calculated current value may be output to the higher-level ECU via the output terminal 7 (digital output).

The current sensor 1 configured as described above is fastened to the battery post P by tightening the tightening end portion 20g by the tightening mechanism 10 in a state where the battery post P is inserted into the post insertion holes 20d and 20e of the battery terminal portion 2. The tightening mechanism 10 is a mechanism for fastening the battery terminal portion 2 to the battery post P by tightening the tightening end portion 20g of the battery terminal portion 2 along the second width direction Z. Here, as an example, the tightening mechanism 10 includes a plate nut 11 as a penetrating member, a fastening bolt 12 as a fastening member, and a bracket 13 as a pressing force conversion member, which work together to generate a force that tightens the tightening end portion 20g along the second width direction Z. The tightening mechanism 10 is attached to the tightening end portion 20g with the plate nut 11 being inserted into the tightening end portion 20g in a positional relationship so as to cross the slit 20f along the second width direction Z, and the fastening bolt 12 and the bracket 13 being assembled to the plate nut 11.

Although a detailed description is omitted, when the battery terminal portion 2 is fastened to the battery post P, the tightening mechanism 10 tightens the fastening bolt 12 along the axis direction X with the battery post P inserted into the post insertion holes 20d and 20e. As a result, the tightening mechanism 10 generates a tightening force along the axis direction X between the fastening bolt 12 and the plate nut 11. Then, the tightening mechanism 10 converts the generated tightening force into a pressing force along the second width direction Z by an action of the plate nut 11 and the bracket 13. Then, the tightening mechanism 10 tightens the tightening end portion 20g via the plate nut 11 and the bracket 13 by the converted pressing force so as to narrow a width of the slit 20f along the second width direction Z. As a result, the tightening mechanism 10 can reduce the diameters of the post insertion holes 20d and 20e, and fasten the battery terminal portion 2 to the battery post P to conduct conduction. Note that the tightening mechanism 10 is not limited to the above type, may include, for example, bolts and nuts, and may be of a type in which the tightening end portion 20g is tightened along the second width direction Z by tightening the bolt along the second width direction Z.

Then, in the current sensor 1, the connection terminal T is fastened to the shaft portion 5a, and the connection terminal T and the fastening portion 31 of the terminal connection portion 3 are electrically connected, by assembling the connection terminal T to the shaft portion 5a of the stud bolt 5 and screwing the nut 5c.

In this state, the current sensor 1 detects the current flowing between the connection terminal T and the battery post P by the sensor unit 4, and outputs the detected sensor output to the higher-level ECU via the connector portion CN. That is, the current sensor 1 amplifies and outputs a voltage (detection voltage) generated across the shunt resistor 40 according to the current flowing through the shunt resistor 40 by the amplifier AP, and detects the current flowing through the shunt resistor 40 based on the output of the amplifier AP. In this case, the main body that actually calculates the current value may be a microcomputer mounted on the circuit board 8 or a higher-level ECU that is the output destination of the sensor output.

Then, in the current sensor 1 of the present embodiment, by embedding the end portions 20aa and 20ba of the pair of plate-shaped portions 20a and 20b in the housing 6 at intervals along the axis direction X, as described above, it is possible to secure an appropriate resonance resistance performance against vehicle vibration.

More specifically, with this configuration, in a state where the battery terminal portion 2 is fastened to the battery post P and the housing 6 including the sensor unit 4 is supported in a cantilever shape, the current sensor 1 can suppress the amplitude along the axis direction X when vibration is applied to be relatively small.

Figure 10:
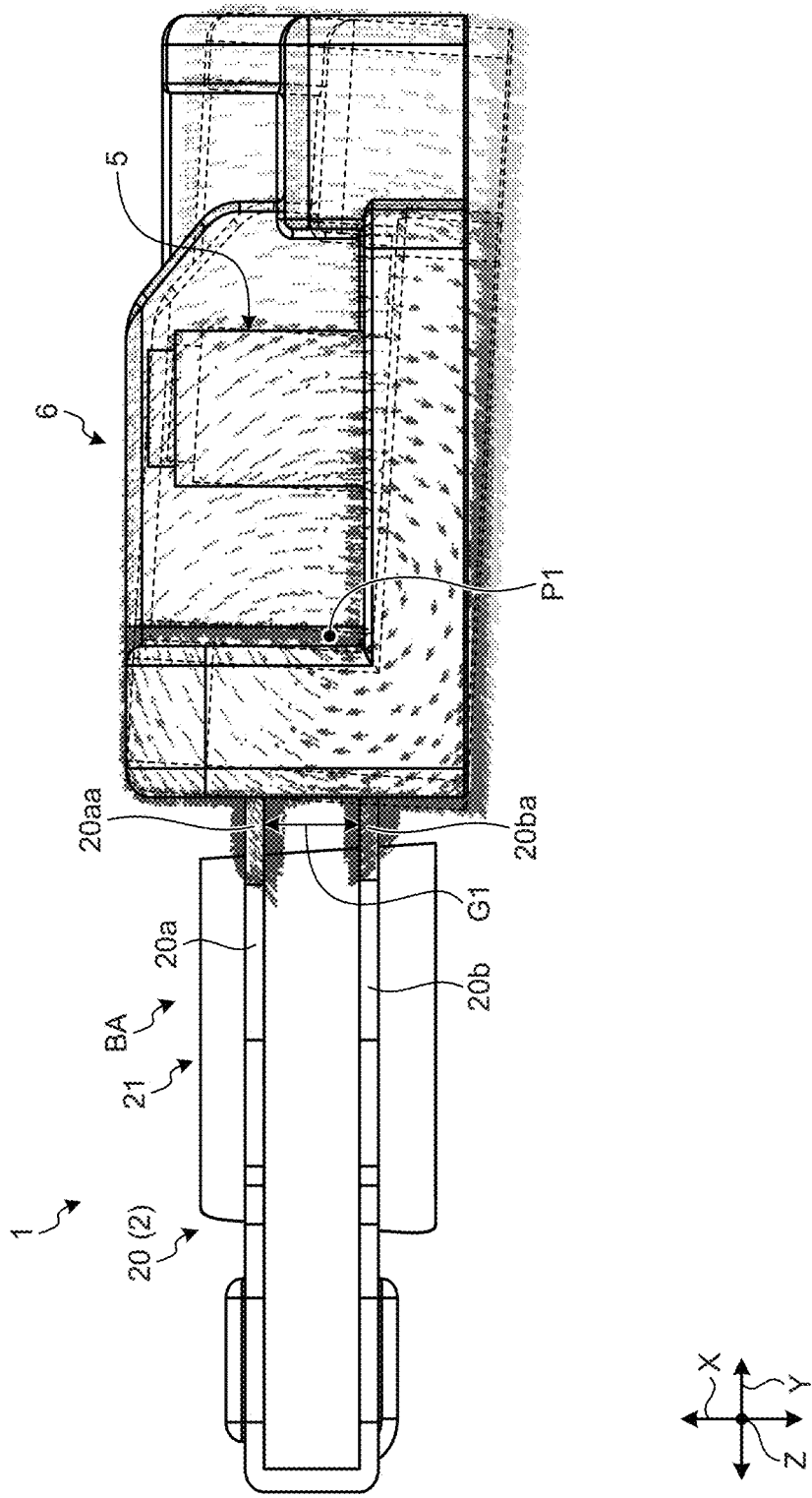
FIG. 10 is a schematic diagram illustrating an example of a vibration simulation result of the current sensor according to the embodiment.
Figure 11:
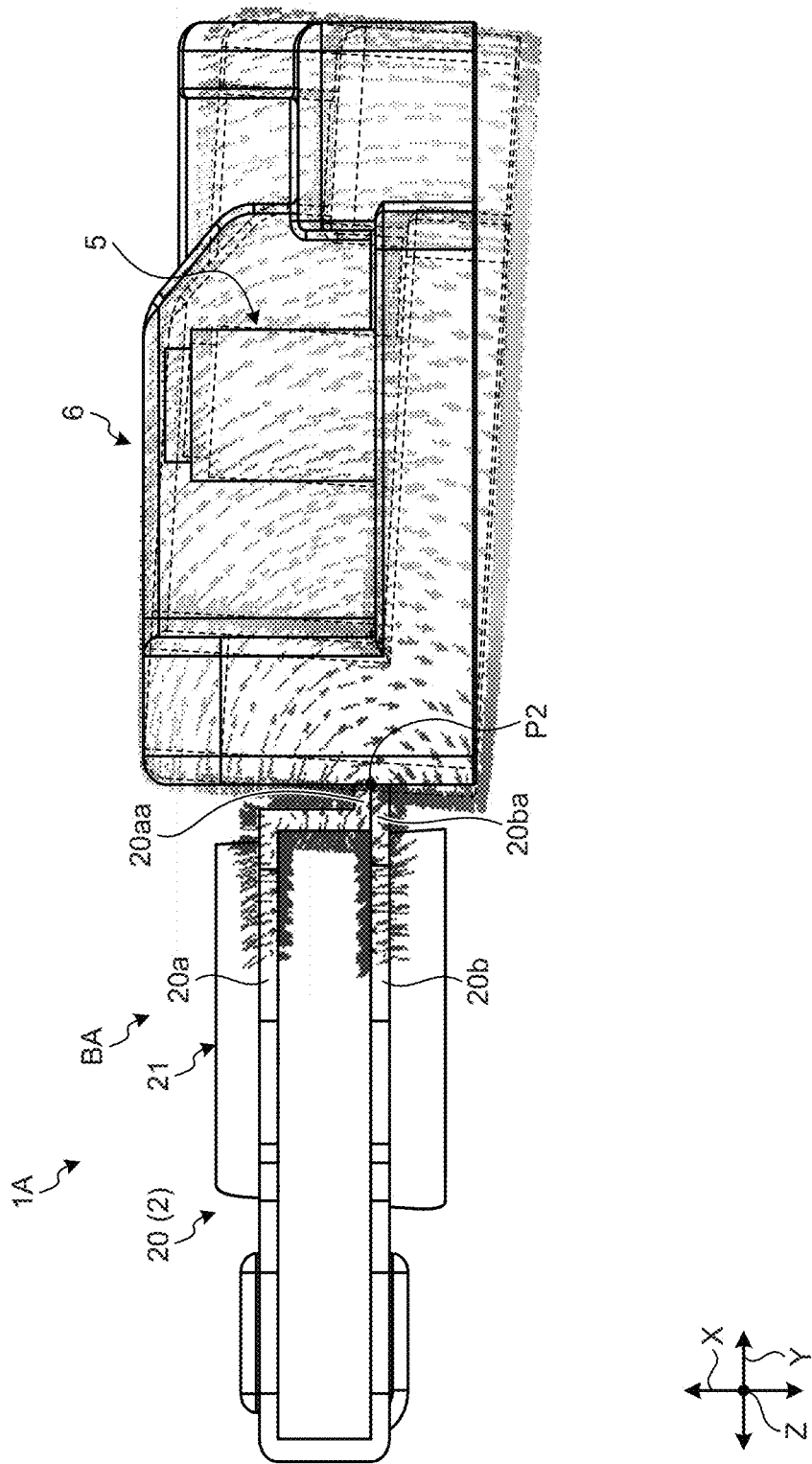
FIG. 11 is a schematic diagram illustrating an example of a vibration simulation result of a current sensor according to a comparative example.

FIG. 10 is a schematic diagram illustrating an example of a vibration simulation result of the current sensor 1 according to the present embodiment. On the other hand, FIG. 11 is a schematic diagram illustrating an example of a vibration simulation result of a current sensor 1A according to a comparative example. The current sensor 1A according to the comparative example differs from the current sensor 1 of the present embodiment in that the end portion 20aa of the plate-shaped portion 20a is bent by 90° toward the plate-shaped portion 20b, and the end portions 20aa and 20ba are embedded in the housing 6 in a state of being closely overlapped with each other along the axis direction X without a gap. Other configurations of the current sensor 1A according to the comparative example are substantially the same as those of the current sensor 1 of the present embodiment.

The results of the vibration simulations illustrated in FIGS. 10 and 11 show the results of resonance point analysis performed with the current sensors 1 and 1A fastened to the battery post P and the connection terminal T not assembled. In this resonance point analysis, after setting "solver: stress analysis", and "analysis type: resonance analysis" using "Femtet (registered trademark) ver. 2019.0.1.72107 (64 bit)" as analysis software, a first resonance frequency (lowest resonance frequency) was confirmed to confirm the influence on vehicle vibration. The arrows in FIGS. 10 and 11 indicate a displacement direction and a displacement amount at each portion of the current sensors 1 and 1A, and the longer the arrow length, the larger the displacement amount. In addition, points P1 and P2 in FIGS. 10 and 11 represent vibration center points when vibration is applied. Note that FIGS. 10 and 11 do not illustrate the battery post P, the tightening mechanism 10, and the like.

As is clear from FIGS. 10 and 11, in the current sensor 1 according to the present embodiment, the vibration center point P1 is located away from the battery terminal portion 2 side (in other words, the battery post P side) with respect to the first width direction Y as compared with the vibration center point P2 of the current sensor 1A according to the comparative example. That is, in the current sensor 1 according to the present embodiment, the vibration center point P1 is located on the tip side of the housing 6 supported in a cantilever shape by the battery post P via the battery terminal portion 2 as compared with the vibration center point P2 of the current sensor 1A according to the comparative example. As a result, the current sensor 1 according to the present embodiment has relatively small amplitude along the axis direction X when vibration is applied, as compared with the current sensor 1A according to the comparative example, and as a result, the first resonance frequency shifts to a relatively high frequency side.

Figure 12:
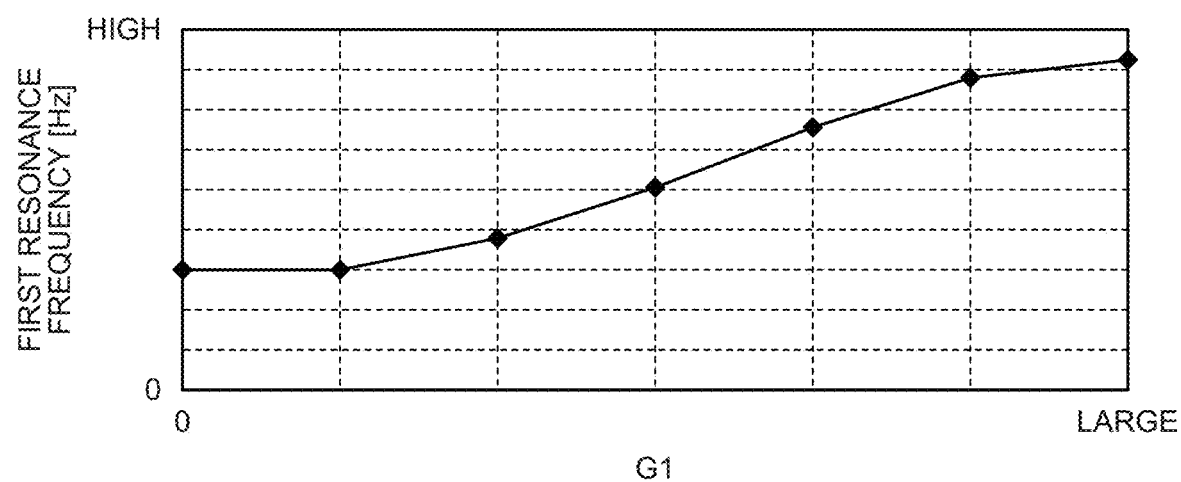
FIG. 12 is a diagram illustrating an example of a vibration simulation result of the current sensor according to the embodiment.

FIG. 12 is a diagram illustrating a tendency of a gap G1 and the first resonance frequency in the current sensor 1 according to the present embodiment. Here, the gap G1 in the current sensor 1 is a gap along the axis direction X between the end portion 20aa and the end portion 20ba, as illustrated in FIG. 10, and FIG. 12 illustrates the tendency of the first resonance frequency when the gap G1 is gradually increased by a value obtained by multiplying a predetermined unit dimension by an integer. In FIG. 12, a horizontal axis is a length of the gap G1 and a vertical axis is the first resonance frequency.

As is clear from FIG. 12, in the current sensor 1 according to the present embodiment, as the gap G1 becomes relatively large, the vibration center point P1 shifts further toward the tip side of the housing 6, and the amplitude decreases, and the first resonance frequency tends to shift to the relatively high frequency side. In general, the vehicle vibration generated in the vehicle V tends to be 1000 Hz or less. Therefore, in the current sensor 1 of the present embodiment, the first resonance frequency is shifted to the relatively high frequency side, so that the first resonance frequency can be set to be the vibration region (region of 1000 Hz or less) or more generally used in the vehicle V. As a result, the current sensor 1 of the present embodiment can suppress the occurrence of resonance due to vibration caused by vehicle vibration.

The current sensor 1 described above detects the current by the sensor unit 4 electrically connected to the battery terminal portion 2 fastened to the battery post P. In this configuration, the sensor unit 4 is located side by side with the battery terminal portion 2 and is built in the housing 6 having an insulating property. Then, the battery terminal portion 2 has the pair of plate-shaped portions 20a and 20b located so as to face each other along the axis direction X, and the end portions 20aa and 20ba on the sensor unit 4 side of the pair of plate-shaped portions 20a and 20b are embedded in the housing 6 at intervals along the axis direction X. With this configuration, in a state where the battery terminal portion 2 is fastened to the battery post P and the sensor unit 4 and the housing 6 is supported by the battery terminal portion 2, the current sensor 1 can suppress the amplitude along the axis direction X when vibration is applied to be relatively small. As a result, the current sensor 1 can have a relatively high resonance frequency (resonance point), and can secure appropriate resonance resistance performance against vehicle vibration along the axis direction X.

In addition, as a result, in the current sensor 1, for example, in order to secure the resonance resistance performance, since there is no need to secure strength according to an increase in the plate thickness or width of the plate-shaped portions 20a and 20b to relieve stress, or to increase the strength by increasing bending processing, material costs and processing costs can be suppressed, for example, manufacturing costs can be suppressed.

Here, in the current sensor 1 described above, the sensor unit 4 includes a shunt resistor 40 for current detection. Then, the current sensor 1 can secure an appropriate resonance resistance performance as described above in a shunt type current sensor using the shunt resistor 40.

Note that the current sensor according to the embodiment of the present invention described above is not limited to the embodiment described above, and various modifications can be made within the scope described in the claims.

In the above description, it has been described that the battery terminal portion 2 is formed by integrally forming the pair of plate-shaped portions 20a and 20b and the bending connection portion 20c by press bending of a conductive metal plate or the like, but is not limited thereto. For example, the battery terminal portion 2 does not have the bending connection portion 20c, but has the pair of plate-shaped portions 20a and 20b formed separately from each other and has a two-layer split structure, and may have a configuration in which the pair of plate-shaped portions 20a and 20b that are separately formed are integrated.

In the above description, the extension portion 20h has been described as extending from the end portion 20ba of the plate-shaped portion 20b toward the plate-shaped portion 20a along the axis direction X, and being positioned at a distance from an end surface of the end portion 20aa of the plate-shaped portion 20a, but is not limited thereto. The extension portion 20h may be electrically connected to both of the pair of plate-shaped portions 20a and 20b inside the sensor cover portion 61, for example.

In the above description, the current sensor 1 has been described as forming the so-called shunt type current sensor, but is not limited thereto. For example, the sensor unit includes a Hall IC configured by Hall elements that detect a magnetic field using the Hall effect, and the current sensor may be a magnetic detection type current sensor that measures a current by detecting a change in magnetic flux density using the Hall IC.

The current sensor according to the present embodiment detects a current by a sensor unit electrically connected to a battery terminal portion fastened to a battery post. In this configuration, the sensor unit is located side by side with the battery terminal portion and is built in a housing having an insulating property. Then, the battery terminal portion has a pair of plate-shaped portions located so as to face each other along the first direction, and the end portions of the pair of plate-shaped portions on the sensor unit side are embedded in the housing at intervals along the first direction. With this configuration, in a state where the battery terminal portion is fastened to the battery post and the sensor unit and the housing is supported by the battery terminal portion, the current sensor can suppress the amplitude along the first direction when vibration is applied to be relatively small. As a result, the current sensor has the effect that the resonance frequency (resonance point) can be made relatively high, and appropriate resonance resistance performance can be ensured against vehicle vibration along the first direction.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A current sensor comprising:
    a battery terminal portion that is conductive and is fastened to a battery post that extends along a first direction;
    a sensor unit that is located side by side with the battery terminal portion along a second direction that intersects the first direction and is electrically connected to the battery terminal portion to detect a current; and
    a housing that has an insulating property and embeds the sensor unit, wherein
    the battery terminal portion includes a pair of plate-shaped portions, each formed is a plate shape and located so as to face each other along the first direction, and
    the pair of plate-shaped portions are embedded in the housing with each of end portions on the sensor unit side in the second direction spaced apart from each other along the first direction to shift a resonance frequency of the sensor unit higher, thereby reducing or eliminating vibration.

2. The current sensor according to claim 1, wherein the sensor unit includes a shunt resistor for current detection that is electrically connected to one of the pair of plate-shaped portions.

* * * * *